(12) United States Patent
Cheng

(10) Patent No.: US 7,612,587 B2
(45) Date of Patent: Nov. 3, 2009

(54) SEMICONDUCTOR CIRCUITS

(75) Inventor: Wen-Chang Cheng, Taoyuan County (TW)

(73) Assignee: Nanya Technology Corporation, Kueishan, Taoyuan (TW)

( * ) Notice: Subject to any disclaimer, the term of this patent is extended or adjusted under 35 U.S.C. 154(b) by 8 days.

(21) Appl. No.: 11/835,406

(22) Filed: Aug. 7, 2007

(65) Prior Publication Data

US 2008/0219076 A1 Sep. 11, 2008

(30) Foreign Application Priority Data

Mar. 6, 2007 (TW) .............................. 96107638 A

(51) Int. Cl.
*H03K 17/00* (2006.01)
*G06F 1/08* (2006.01)
(52) U.S. Cl. .......................................... 327/99; 327/37
(58) Field of Classification Search .................... 327/99
See application file for complete search history.

(56) References Cited

U.S. PATENT DOCUMENTS

2005/0184764 A1* 8/2005 Kurd et al. .................... 327/99

* cited by examiner

*Primary Examiner*—Lincoln Donovan
*Assistant Examiner*—Daniel Rojas
(74) *Attorney, Agent, or Firm*—Winston Hsu

(57) ABSTRACT

Semiconductor circuit capable of selecting a corresponding adjusting parameter to adjust the received signal according to different voltages and frequencies. A voltage detector detects a voltage level of an external power voltage to generate a voltage detection signal, a frequency detector detects frequency of a main clock to generate a frequency detection signal, and a signal adjustment unit receives a first signal and selects one of a plurality of different adjusting parameters to adjust the first signal according to the voltage detection signal and the frequency detection signal.

18 Claims, 6 Drawing Sheets

SEMICONDUCTOR CIRCUITS

BACKGROUND OF THE INVENTION

1. Field of the Invention

The invention relates to semiconductor circuits, and in particular to semiconductor circuits capable of selecting a corresponding adjusting parameter to adjust the received signal according to different voltages and frequencies.

2. Description of the Related Art

Semiconductor memory devices, such as dynamic random access memories (DRAMs), usually have an internal voltage regulator to convert an external power voltage into an interval power voltage because the external power voltage is more unstable. For example, the internal power voltage is provided to power a memory array (or cell array) in the memory device and peripheral control circuits.

Delay and margin between internal signals in the semiconductor devices cannot be assured if core logic circuits (i.e. memory array and the peripheral control circuits) are powered by the external power voltage directly. Thus, when the memory device is powered by the external power voltage directly, to assure delay and margin between internal signals in the semiconductor devices have became very important.

BRIEF SUMMARY OF THE INVENTION

Embodiments of a semiconductor circuit are provided, in which a voltage detector detects a voltage level of an external power voltage to generate a voltage detection signal, a frequency detector detects frequency of a main clock to generate a frequency detection signal, and a signal adjustment unit receives a first signal and selects one of a plurality of different adjusting parameters to adjust the first signal according to the voltage detection signal and the frequency detection signal.

The invention further provides an embodiment of a semiconductor memory module, in which a clock generator generates a main clock, and a core logic unit is powered by an external power voltage. In the core logic unit, a voltage detector detects a voltage level of the external power voltage to generate a voltage detection signal, a frequency detector detects frequency of the main clock to generate a frequency detection signal, and a signal adjustment unit receives a first signal, obtains a present operating region of the core logic unit and selects one of a plurality of different parameters to adjust the first signal according to the voltage detection signal and the frequency detection signal.

The invention provides an embodiment of a signal adjustment method, in which a voltage level of an external power voltage of a chip is detected to generate a voltage detection signal, frequency of a main clock of the chip is detected to generate a frequency detection signal, a present operating region of the chip is obtained according to the voltage detection signal and the frequency detection signal, and one of a plurality of adjusting parameters is selected to adjust a first signal in the chip according to the obtained present operating region. In the embodiments of the invention, the number of the signal adjustment unit is arbitrary, and the voltage detection signal and the frequency detection signal can be used to control arbitrary number of the signal adjustment unit.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
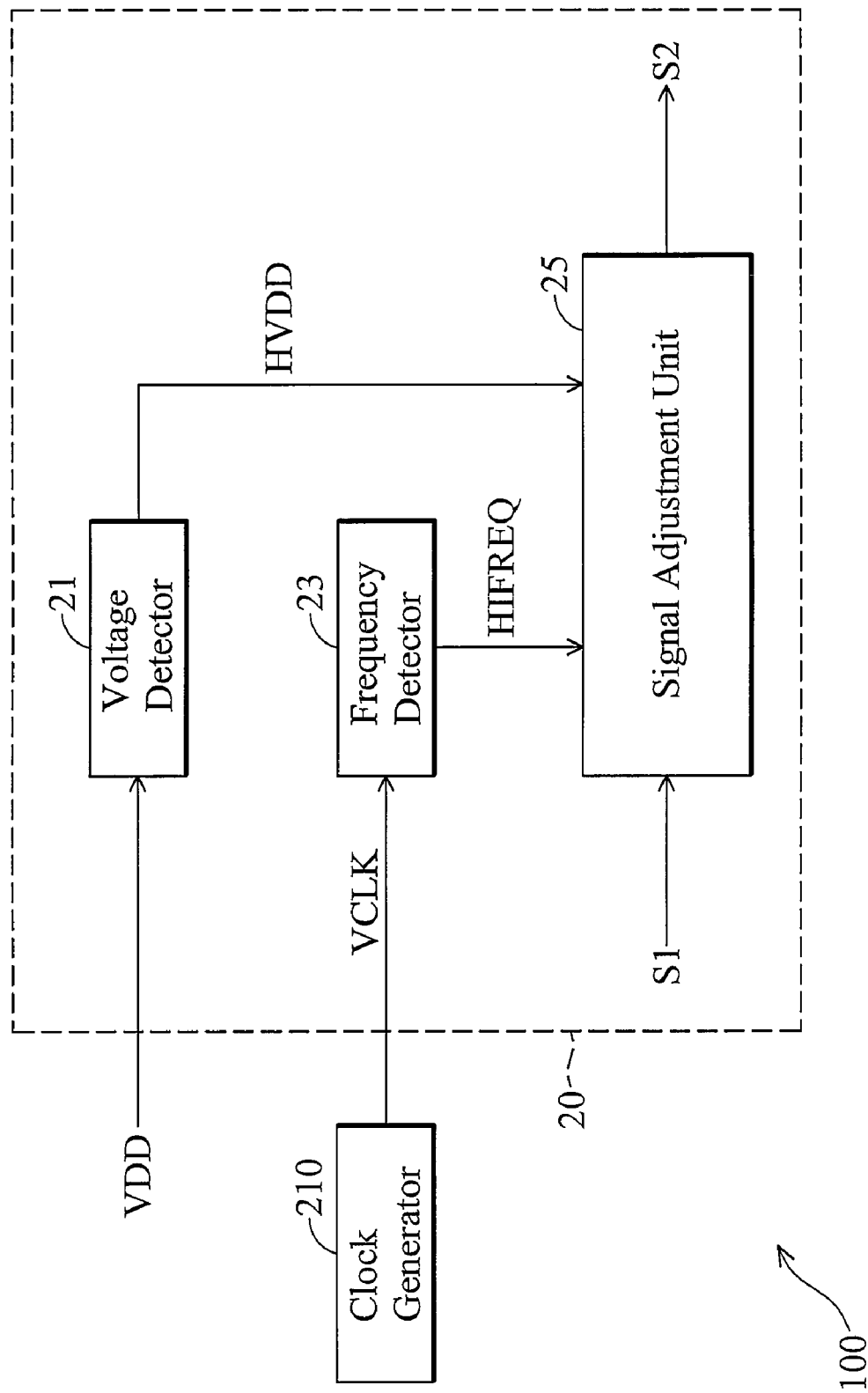
FIG. 1 shows an embodiment of a semiconductor circuit.

FIG. 1 shows an embodiment of a semiconductor circuit. As shown, the semiconductor circuit 100 comprises a voltage detector 21, a frequency detector 23, a signal adjustment unit 25 and utilizes different adjusting parameters to adjust a first signal according to different power voltages and different operating frequencies. For example, semiconductor circuit 100 can be disposed in an internal circuit of a semiconductor clip but is not limited thereto.

The voltage detector 21 detects a voltage level of the external power voltage VDD to obtain a voltage detection signal HVDD. For example, the voltage detector 21 outputs the voltage detection signal HVDD with a high logic level when the external power voltage VDD exceeds a reference voltage, such as VREF. Namely, the chip is operated in a high voltage mode. On the contrary, the voltage detector 21 outputs the voltage detection signal HVDD with a low logic level when the external power voltage VDD is lower than the reference voltage. Namely, the chip is operated in a low voltage mode.

The frequency detector 23 detects a frequency of a main clock VCLK to generate a frequency detection signal HIFREQ. For example, the frequency detector 23 outputs the frequency detection signal HIFREQ with a high logic level when the frequency of the main clock VCLK exceeds a reference frequency. Namely, the chip is operated in a high frequency mode. On the contrary, the frequency detector 23 outputs the frequency detection signal HIFREQ with a low logic level when the frequency of the main clock VCLK is lower than the reference frequency. Namely, the chip is operated in a low frequency mode.

Figure 2:
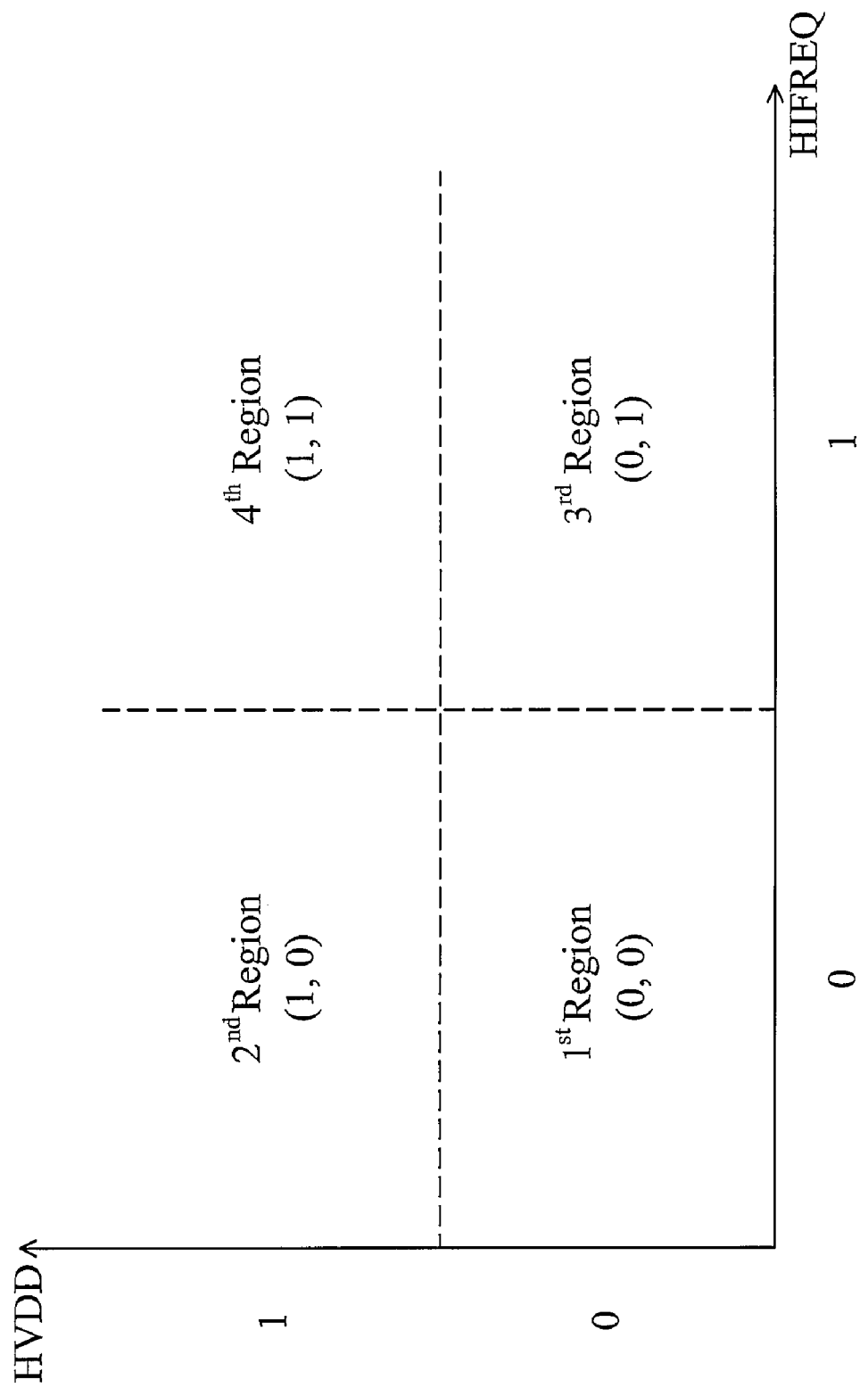
FIG. 2 shows four operation regions divided by different voltage detection signals and frequency detection signals.

The signal adjustment unit 25 is coupled to the first signal S1 and selects one of a plurality of adjusting parameters to adjust the first signal S1 according to the voltage detection signal HVDD and the frequency detection signal HIFREQ, thereby generating a corresponding output signal S2. For example, according to the voltage detection signal HVDD and the frequency detection signal HIFREQ, the chip can be operated in one of four operating regions shown in FIG. 2.

When the voltage detection signal HVDD and the frequency detection signal are both at low logic level, it means that the chip is operated in a low voltage and low frequency operating region. When the voltage detection signal HVDD and the frequency detection signal are both at high logic level, it means that the chip is operated in a high voltage and high frequency operating region. When the voltage detection signal HVDD is at low logic level but the frequency detection signal is at high logic level, it means that the chip is operated in a low voltage and high frequency operating region. When the voltage detection signal HVDD is at high logic level but the frequency detection signal is at low logic level, it means that the chip is operated in a high voltage and low frequency operating region.

The signal adjustment unit 25 comprises a plurality of adjustment units with different adjusting parameters, adjusting the first signal S1 according to the voltage detection signal HVDD and the frequency detection signal HIFREQ. Namely, the signal adjustment unit 25 can selectively adjust the adjusting parameters of the first signal S1 according to external environment parameters of the chip, such as power voltages and clock frequencies, such that the output signal S2 does not cause malfunction of the chip.

In some embodiments, the voltage detector 21 can also compare the external power voltage with a plurality of voltage levels to obtain a set of voltage detection signals and the frequency detector 23 can also compare the frequency of the main clock with a plurality of frequencies to obtain a set of frequency detection signals. Namely, the signal adjustment unit 25 can select an adjustment parameter according to a plurality of voltage detection signals and a plurality of frequency detection signals to adjust the first signal S1 and generate the output signal S2 accordingly.

Figure 3A:
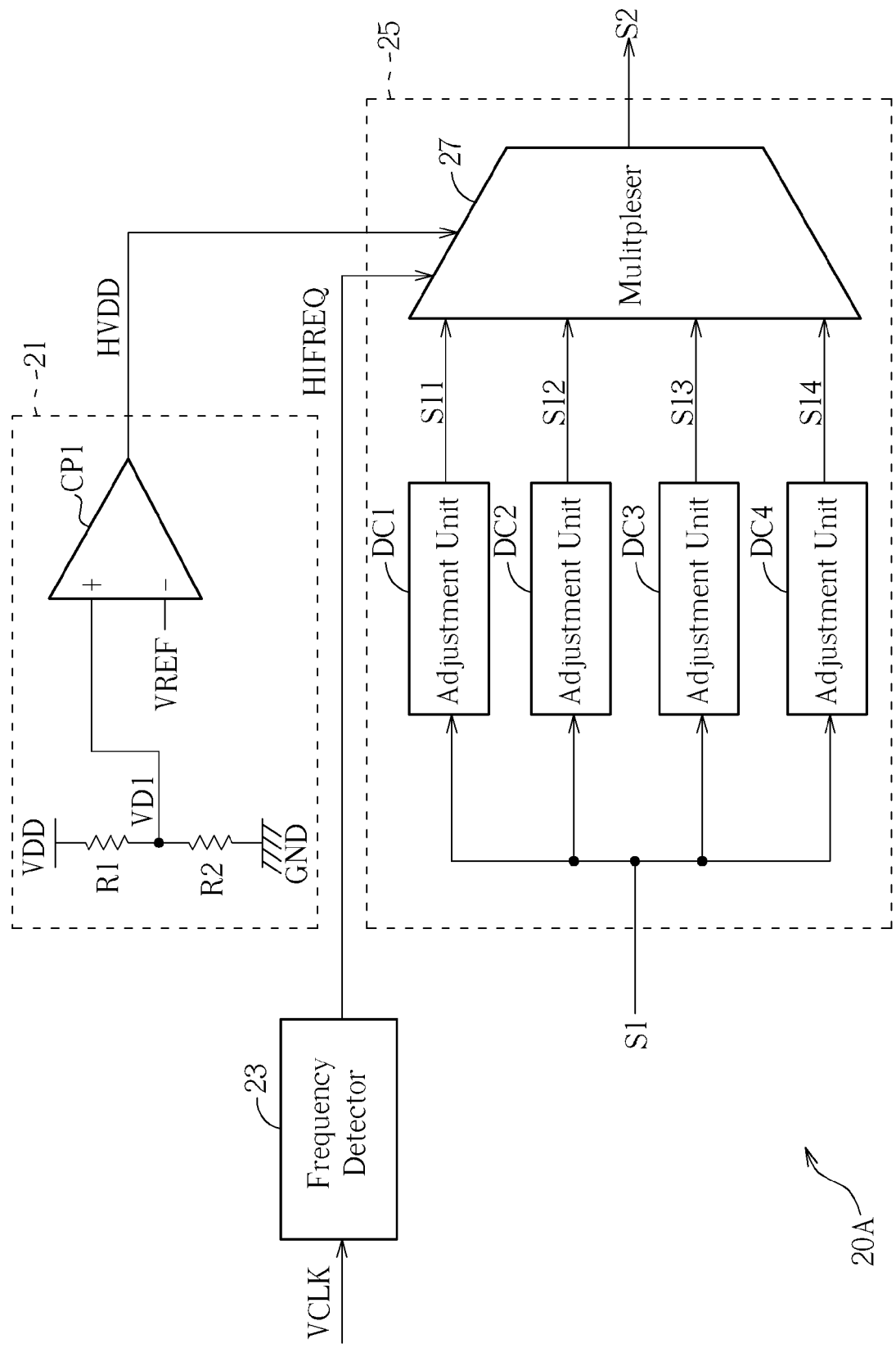
FIG. 3a shows another embodiment of a semiconductor circuit.

FIG. 3a shows another embodiment of a semiconductor circuit. As shown, the semiconductor circuit 20A can be implemented as an adjustable delay circuit and can be disposed in an internal circuit of a semiconductor chip. The semiconductor circuit 20A delays a first signal Si inside a chip according to different power voltages and different operating frequencies, thereby assuring the delay time and/or margin between the first signal S1 and the output signal S2 at an appropriate value.

Similarly, the semiconductor circuit 100 comprises a voltage detector 21, a frequency detector 22 and a signal adjustment circuit 25, in which the voltage detector 21 comprises resistors R1 and R2 and a comparator CP1. The resistors R1 and R2 are coupled in series between an external power voltage VDD outside the chip and a ground voltage GND, generating a divided voltage VD1. The comparator CP1 is coupled to the divided voltage VD1 and a reference voltage VREF and compares the divided voltage VD1 and a reference voltage VREF to generate a voltage detection signal HVDD with different logic levels. For example, the reference voltage VREF can be generated by a bandgap circuit and voltage division circuit in the chip, but is not limited thereto.

For example, when the divided voltage VD1 exceeds the reference voltage VREF (i.e., the external power voltage VDD exceeds the reference voltage VREF), the voltage detector 21 outputs the voltage detection signal HVDD with a high logic level. It represents that the chip is operated in a high voltage mode. On the contrary, when the external power voltage VDD is lower than the reference voltage VREF, the voltage detector. 21 outputs the voltage detection signal HVDD with a low logic level. It represents that the chip is operated in a low voltage mode.

The frequency detector 23 detects a frequency of a main clock VCLK to generate a frequency detection signal HIFREQ. For example, when the frequency of the main clock VCLK exceeds a reference frequency, the frequency detector 23 outputs the frequency detection signal HIFREQ with a high logic level. Namely, the chip is operated in a high frequency mode. On the contrary, when the frequency of the main clock VCLK is lower than a reference frequency, the frequency detector 23 outputs the frequency detection signal HIFREQ with a low logic level. Namely, the chip is operated in a low frequency mode.

Figure 3B:
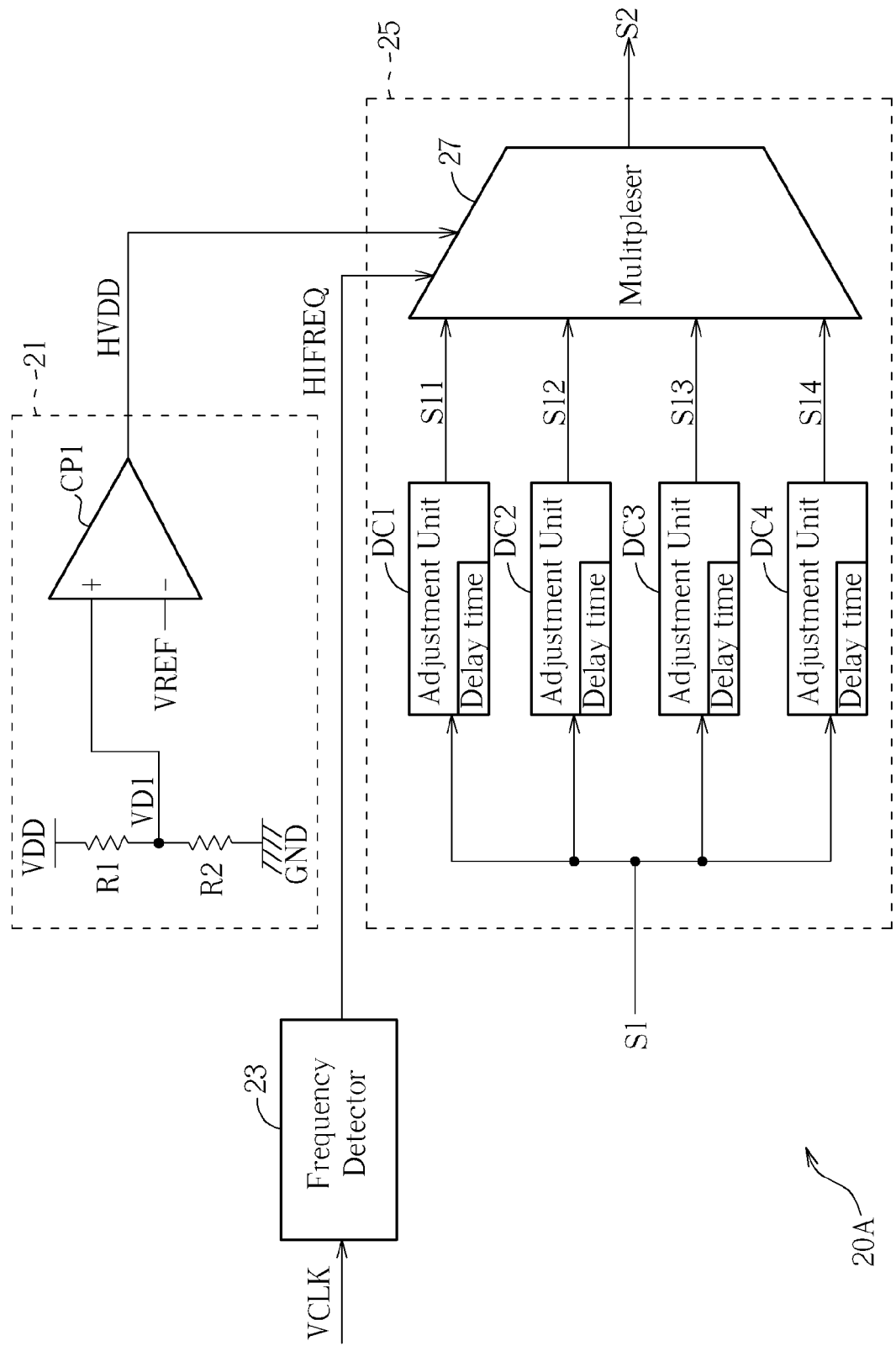
FIG. 3b shows another embodiment of a semiconductor circuit.

The signal adjustment unit 25 comprises a plurality of adjustment units DC1 and DC4 and a multiplexer 27, and selects one of adjustment units DC1~DC4 according to the logic levels of the voltage detection signal HVDD and the frequency detection signal HIFREQ to adjust the first signal S1. For example, as shown in Fig.3b, the adjustment units DC1~DC4 can be delay circuits with different delay times. The multiplexer 27 selectively outputs one of the signals output from the adjustment unit (i.e., delay circuits) DC1~DC4 to serve as the output signal S2 according to the logic levels of voltage detection signal HVDD and the frequency detection signal HIFREQ.

For example, when the chip is operated in the first region (0,0), i.e., a low voltage and low frequency mode, the multiplexer 27 outputs the signal S11 to serve as the output signal S2. When the chip is operated in the first region (1,0), i.e., a high voltage and low frequency mode, the multiplexer 27 outputs the signal S12 to serve as the output signal S2, and so on.

Hence, the first signal S1 can be delayed by different delay times according to different frequencies and different voltages, i.e., an appropriate delay time between the first signal S1 and the output signal S2 can be assured.

In some embodiments, the signal adjustment unit 25 can select a corresponding one of level shifters to adjust the first signal S1 according to different operating voltages and clock frequencies, thereby obtaining a desired output signal S2. In another embodiments of the invention, the number of the signal adjustment unit 25 is arbitrary (i.e., the number of the signal adjustment 25 can be 1, 2, or more), and the voltage detection signal and the frequency detection signal can be used to control arbitrary number of the signal adjustment unit.

Figure 4:
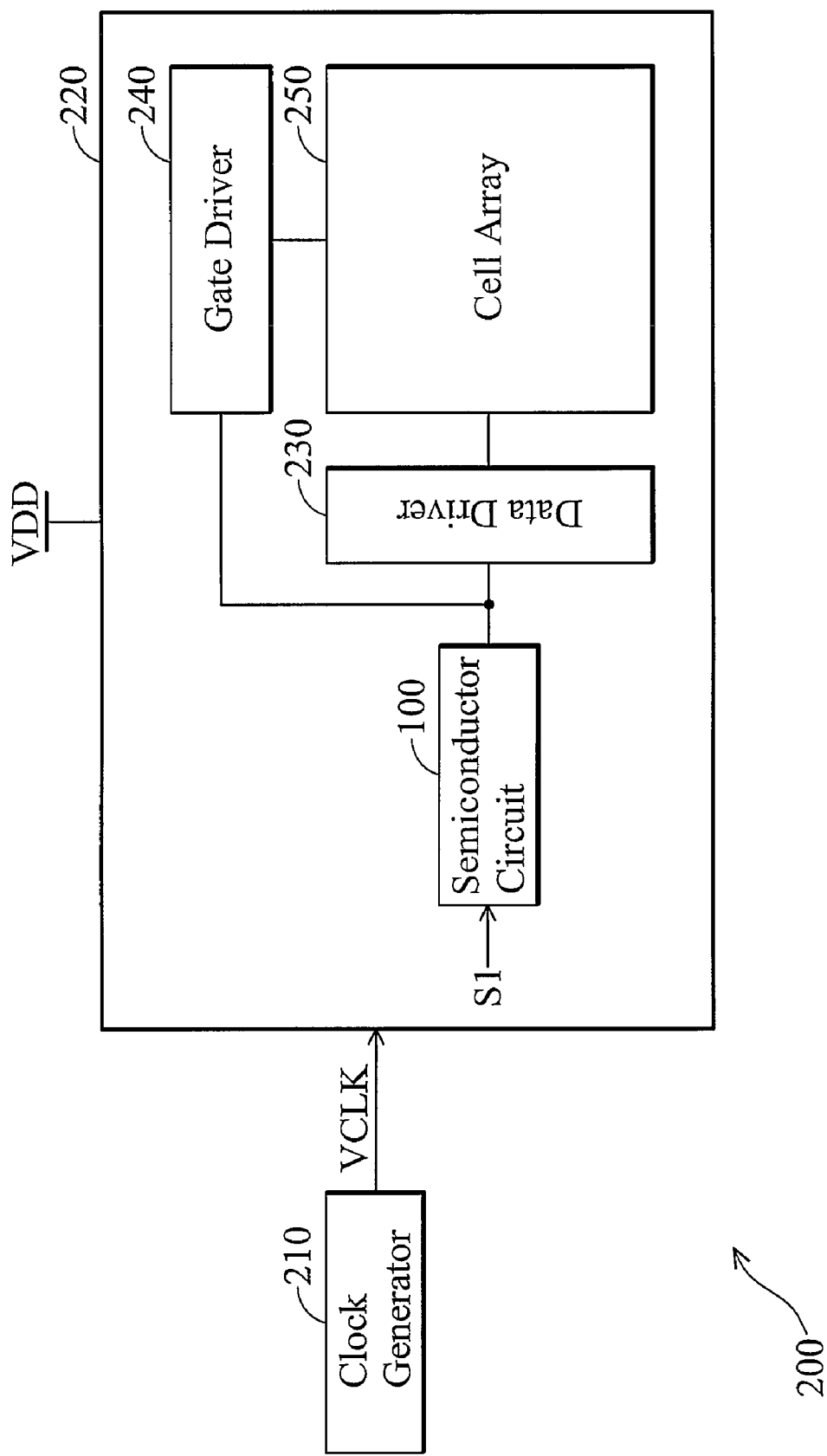
FIG. 4 shows an embodiment of a semiconductor memory module.

FIG. 4 shows an embodiment of a semiconductor memory module. As shown, the semiconductor memory module 200 comprises a clock generator 210 and a core logic unit 220. For example, the semiconductor memory module 200 can be a dynamic random access memory (DRAM), but is not limited thereto. In the embodiment, the clock generator 210 generates a main clock VCLK and supplies it to the core logic unit 220. The core logic unit 220 is powered by an external power voltage VDD directly (i.e. without a voltage regulator) and comprises a data driver 230, a gate driver 240, a memory array 250 and the disclosed semiconductor circuit 100. The data driver 230 and the gate driver 240 are cooperated to access the data stored in the memory array 250. According to variations in the external power voltage and the frequency of the main clock VCLK, the semiconductor circuit 100 selects an adjustment parameter to adjust the first signal S1 for generating the output signal S2 to output to the data driver 230 or the gate driver 240.

For example, when the semiconductor memory module 200 is powered by the external power voltage directly, the semiconductor circuit 100 can be an adaptable delay circuit to provide different delay times to delay signals according to different power voltages and different main clocks, such that an appropriate delay time and/or margin between the first signal S1 and the output signal S2 can be assured.

Figure 3C:
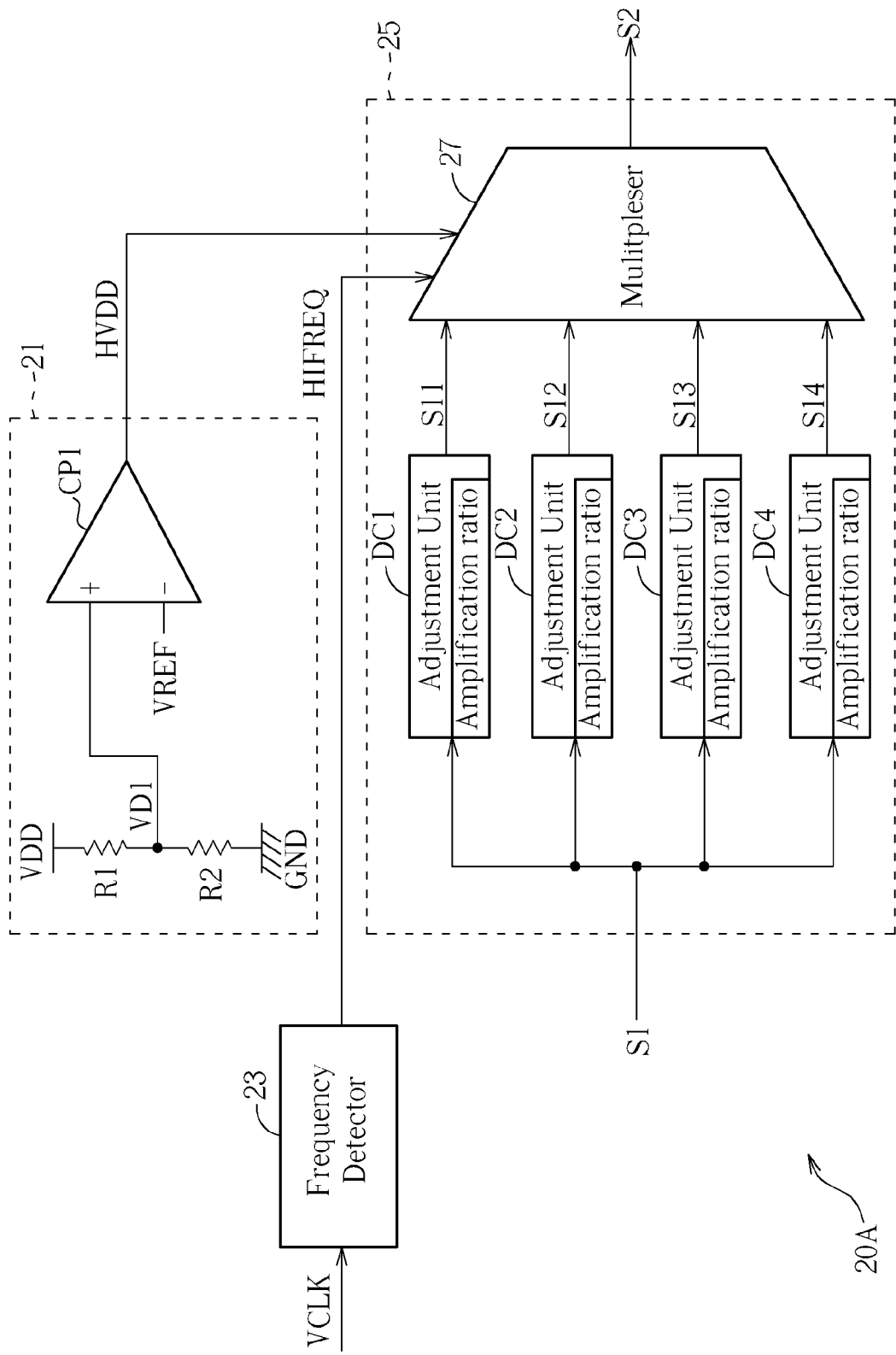
FIG. 3c shows another embodiment of a semiconductor circuit.

In some embodiments, as shown in Fig. 3c which illustrates that adjustments units DC1~DC4 use amplification ratios as adjusting ratios as adjusting parameters, the semiconductor circuit 20A can be an adaptable amplifier to provide different amplification ratios to amplify signal, but is not limited thereto.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor circuit, comprising:
   a voltage detector detecting a voltage level of an external power voltage to generate a voltage detection signal;
   a frequency detector detecting frequency of a main clock to generate a frequency detection signal; and
   a signal adjustment unit receiving a first signal, and selecting one of a plurality of different adjusting parameters to adjust the first signal to generate a plurality of second signals and selectively output one of the second signals according to the voltage detection signal and the frequency detection signal.

2. The semiconductor circuit as claimed in claim 1, wherein the signal adjustment unit comprises a plurality of adjustment units with different adjusting parameters.

3. The semiconductor circuit as claimed in claim 2, wherein the signal adjustment unit selects one of the adjustment units to adjust the first signal according to the voltage detection signal and the frequency detection signal.

4. The semiconductor circuit as claimed in claim 1, wherein the adjusting parameters are delay times.

5. The semiconductor circuit as claimed in claim 1, wherein the adjusting parameters are amplification ratios.

6. The semiconductor circuit as claimed in claim 1, wherein the voltage detector comprises:
   a voltage dividing unit coupled between the external power voltage and a ground voltage to generate a divided voltage; and
   a comparator comparing the divided voltage and an internal reference voltage to generate the voltage detection signal with different logic levels.

7. The semiconductor circuit as claimed in claim 1, wherein the semiconductor device is disposed in a core logic unit of a chip.

8. A semiconductor memory module, comprising:
   a clock generator generating a main clock; and
   a core logic unit powered by an external power voltage and comprising:
      a voltage detector detecting a voltage level of the external power voltage to generate a voltage detection signal;
      a frequency detector detecting frequency of the main clock to generate a frequency detection signal; and
      a signal adjustment unit receiving a first signal, and obtaining a present operating region of the core logic unit and selecting one of a plurality of different parameters to adjust the first signal to generate a plurality of second signals and selectively output one of the second signals according to the voltage detection signal and the frequency detection signal.

9. The semiconductor memory module as claimed in claim 8, wherein the signal adjustment unit comprises a plurality of adjustment units with the different adjusting parameters.

10. The semiconductor memory module as claimed in claim 9, wherein the signal adjustment unit selects one of the adjustment units to adjust the first signal according to the voltage detection signal and the frequency detection signal.

11. The semiconductor memory module as claimed in claim 8, wherein the adjusting parameters are delay times.

12. The semiconductor memory module as claimed in claim 8, wherein the adjusting parameters are amplification ratios.

13. The semiconductor memory module as claimed in claim 8, wherein the voltage detector comprises:
   a voltage dividing unit coupled between the external power voltage and a ground voltage to generate a divided voltage; and
   a comparator comparing the divided voltage and an internal reference voltage to generate the voltage detection signal with different logic levels.

14. The semiconductor memory module as claimed in claim 8, wherein the semiconductor memory module is a semiconductor memory device.

15. The semiconductor memory module as claimed in claim 8, wherein the semiconductor memory module is a dynamic random access memory (DRAM).

16. A signal adjustment method, comprising:
   detecting a voltage level of an external power voltage of a chip to generate a voltage detection signal;
   detecting frequency of a main clock of the chip to generate a frequency detection signal;
   obtaining a present operating region of the chip according to the voltage detection signal and the frequency detection signal; and
   selecting one of a plurality of adjusting parameters to adjust a first signal in the chip to generate a plurality of second signals and selectively output one of the second signals according to the obtained present operating region.

17. The signal adjustment method as claimed in claim 16, wherein the adjusting parameters are delay times.

18. The signal adjustment method as claimed in claim 16, wherein the adjusting parameters are amplification ratios.

* * * * *